US011355337B2

(12) United States Patent
Kamiya et al.

(10) Patent No.: US 11,355,337 B2
(45) Date of Patent: Jun. 7, 2022

(54) SUBSTRATE TREATMENT DEVICE AND SUBSTRATE TREATMENT METHOD

(71) Applicant: Shibaura Mechatronics Corporation, Yokohama (JP)

(72) Inventors: Masaya Kamiya, Kanagawa (JP); Kensuke Demura, Kanagawa (JP); Daisuke Matsushima, Kanagawa (JP); Haruka Nakano, Kanagawa (JP); Ivan Petrov Ganachev, Kanagawa (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 200 days.

(21) Appl. No.: 16/916,288

(22) Filed: Jun. 30, 2020

(65) Prior Publication Data

US 2020/0335324 A1 Oct. 22, 2020

Related U.S. Application Data

(62) Division of application No. 15/671,529, filed on Aug. 8, 2017, now Pat. No. 10,734,217.

(30) Foreign Application Priority Data

Aug. 9, 2016 (JP) ................................ 2016-156786

(51) Int. Cl.
*H01L 21/02* (2006.01)
*G03F 7/40* (2006.01)
(Continued)

(52) U.S. Cl.
CPC .......... *H01L 21/02052* (2013.01); *B08B 3/10* (2013.01); *B08B 7/0092* (2013.01); *G03F 7/40* (2013.01); *G03F 7/422* (2013.01); *H01L 21/02057* (2013.01); *H01L 21/67051* (2013.01); *H01L 21/67109* (2013.01); *H01L 21/67248* (2013.01); *H01L 21/67253* (2013.01); *H01L 21/68764* (2013.01); *H01L 22/12* (2013.01)

(58) Field of Classification Search
CPC ... B08B 3/10; B08B 7/0092; H01L 21/68764; H01L 21/67253; H01L 21/67248;
(Continued)

(56) References Cited

U.S. PATENT DOCUMENTS 6,488,779 B1 12/2002 Lohmuller
2007/0131246 A1 6/2007 Izumi
(Continued)

FOREIGN PATENT DOCUMENTS

JP 2008-107014 A 5/2008
JP 2008-130952 A 6/2008
(Continued)

*Primary Examiner* — Benjamin L Osterhout
(74) *Attorney, Agent, or Firm* — Pearne & Gordon LLP

(57) ABSTRACT

A substrate treatment device according to an embodiment includes a placement portion on which a substrate is placed and rotated, a liquid supply portion which supplies a liquid to a surface on an opposite side to the placement portion of the substrate, a cooling portion which supplies a cooling gas to a surface on a side of the placement portion of the substrate, and a control portion which controls at least one of a rotation speed of the substrate, a supply amount of the liquid, and a flow rate of the cooling gas. The control portion brings the liquid present on a surface of the substrate into a supercooled state and causes at least a part of the liquid brought into the supercooled state to freeze.

7 Claims, 5 Drawing Sheets

(51) Int. Cl.

| | |
|---|---|
| ***G03F 7/42*** | (2006.01) |
| ***B08B 3/10*** | (2006.01) |
| ***B08B 7/00*** | (2006.01) |
| ***H01L 21/67*** | (2006.01) |
| ***H01L 21/687*** | (2006.01) |
| ***H01L 21/66*** | (2006.01) |

(58) Field of Classification Search
CPC ............... H01L 22/12; H01L 21/02057; H01L 21/02052; H01L 21/67109; H01L 21/67051; G03F 7/40; G03F 7/422
See application file for complete search history.

(56) References Cited

U.S. PATENT DOCUMENTS

| | | | |
|---|---|---|---|
| 2007/0235062 | A1 | 10/2007 | Fujiwara et al. |
| 2008/0121251 | A1 | 5/2008 | Miya |
| 2008/0121252 | A1 | 5/2008 | Miya |
| 2009/0126760 | A1 | 5/2009 | Banerjee et al. |
| 2010/0313915 | A1 | 12/2010 | Fujiwara et al. |
| 2012/0175819 | A1 | 7/2012 | Miya et al. |
| 2012/0186275 | A1 | 7/2012 | Kato et al. |
| 2013/0068257 | A1 | 3/2013 | Tomita et al. |
| 2013/0167877 | A1 | 7/2013 | Fujiwara |
| 2015/0020850 | A1 | 1/2015 | Kato et al. |
| 2016/0240406 | A1 | 8/2016 | Kajihara |
| 2016/0279679 | A1 | 9/2016 | Kitagawa et al. |

FOREIGN PATENT DOCUMENTS

| | | | |
|---|---|---|---|
| JP | 2012-064760 | A | 3/2012 |
| JP | 2012-074554 | A | 4/2012 |
| JP | 2013-069764 | A | 4/2013 |
| JP | 2014-022664 | A | 2/2014 |
| JP | 5497599 | B2 | 5/2014 |
| TW | 201340198 | A | 10/2013 |
| TW | 201532179 | A | 8/2015 |

SUBSTRATE TREATMENT DEVICE AND SUBSTRATE TREATMENT METHOD

CROSS-REFERENCE TO RELATED APPLICATIONS

This application is based upon and claims the benefit of U.S. patent application Ser. No. 15/671,529 filed on Aug. 8, 2017, which claims priority from Japanese Patent Application No. 2016-156786, filed on Aug. 9, 2016; the entire contents of which are incorporated herein by reference.

FIELD

Embodiments described herein relate generally to a substrate treatment device and a substrate treatment method.

BACKGROUND

In a microstructure such as a template for imprinting, a mask substrate for photolithography, or a semiconductor wafer, a minute concave convex portion is formed on a surface of a substrate.

Here, as a method of removing a contaminant such as a particle adhered to the surface of the substrate, an ultrasonic cleaning method, a two-fluid spray cleaning method, etc. are known. However, if an ultrasonic wave is applied to the substrate or a fluid is sprayed onto the surface of the substrate, the minute concave convex portion formed on the surface of the substrate may be damaged. Further, recently, miniaturization of the concave convex portion has progressed, and the concave convex portion is more likely to be damaged.

Therefore, as a method of removing a contaminant adhered to the surface of the substrate, a freeze cleaning method has been proposed.

In the freeze cleaning method, first, pure water is supplied to the surface of the rotated substrate, and a part of the supplied pure water is discharged to form a water film on the surface of the substrate. Subsequently, a cooling gas is supplied to the substrate on a side where the water film is formed to freeze the water film. When the water film is frozen and an ice film is formed, the contaminant is incorporated into the ice film, and therefore, the contaminant is separated from the surface of the substrate. Subsequently, pure water is supplied to the ice film to thaw the ice film, and the contaminant is removed from the surface of the substrate along with the pure water.

According to the freeze cleaning method, the minute concave convex portion formed on the surface of the substrate can be prevented from being damaged.

However, when the cooling gas is supplied to the substrate on a side where the water film is formed, freezing starts from a side of the surface of the water film (on an opposite side to the substrate of the water film). When freezing starts from the side of the surface of the water film, it becomes difficult to separate an impurity adhered to the surface of the substrate from the surface of the substrate. Therefore, it was difficult to improve a contaminant removal efficiency.

SUMMARY

A substrate treatment device according to an embodiment includes a placement portion on which a substrate is placed and rotated, a liquid supply portion which supplies a liquid to a surface on an opposite side to the placement portion of the substrate, a cooling portion which supplies a cooling gas to a surface on a side of the placement portion of the substrate, and a control portion which controls at least one of a rotation speed of the substrate, a supply amount of the liquid, and a flow rate of the cooling gas. The control portion brings the liquid present on a surface of the substrate into a supercooled state and causes at least a part of the liquid brought into the supercooled state to freeze.

DETAILED DESCRIPTION

Figure 1:
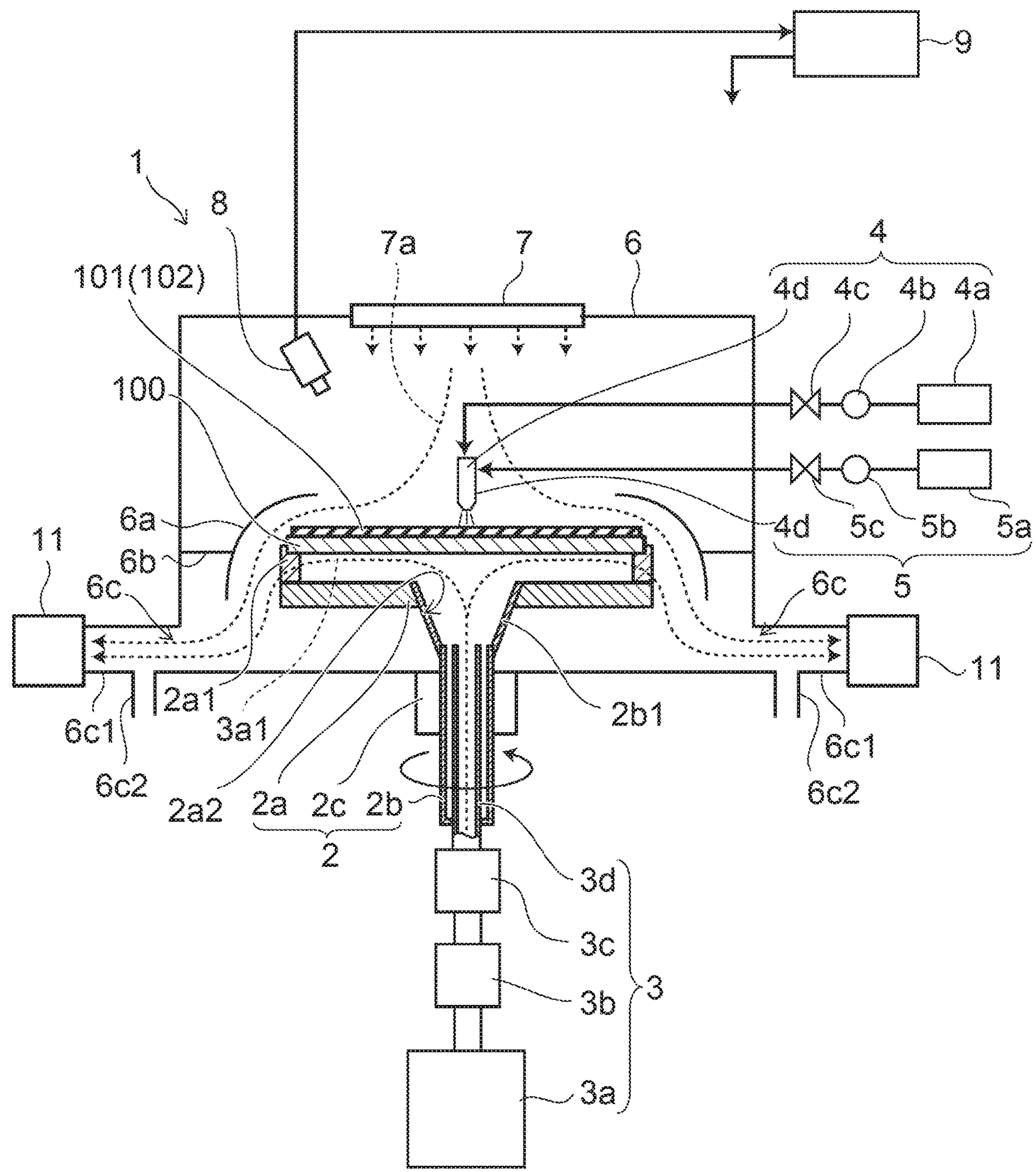
FIG. 1 is a schematic view for illustrating a substrate treatment device according to the embodiment.

Embodiments will now be described with reference to the drawings. Similar components in the drawings are marked with like reference numerals, and a detailed description is omitted as appropriate.

The substrate 100 exemplified below can be, for example, a semiconductor wafer, an imprint template, a mask substrate for photolithography, a plate-like body used for MEMS (Micro Electro Mechanical Systems), and the like.

However, the application of the substrate 100 is not limited to these.

FIG. 1 is a schematic view for illustrating a substrate treatment device 1 according to the embodiment.

As shown in FIG. 1, in the substrate treatment device 1, a placement portion 2, a cooling portion 3, a first liquid supply portion 4, a second liquid supply portion 5, a housing 6, an air blowing portion 7, a measurement portion 8, a control portion 9, and an exhaust portion 11 are provided.

The placement portion 2 has a placement table 2*a*, a rotation shaft 2*b*, and a drive portion 2*c*.

The placement table 2*a* is provided inside the housing 6. The placement table 2*a* has a plate shape.

On one major surface of the placement table 2*a*, a plurality of projection portions 2*a*1 for holding a substrate 100 is provided. On the plurality of projection portions 2*a*1, the substrate 100 is placed. When the substrate 100 is placed, a surface on a side where a concave convex portion is formed of the substrate 100 is made to face on an opposite side to the placement table 2*a*. The concave convex portion can be, for example, a pattern. The plurality of projection portions 2*a*1 holds a periphery of the substrate 100. By allowing the plurality of projection portions 2*a*1 to hold a periphery of the substrate 100, a portion where the substrate 100 and an element on a side of the placement table 2*a* come into contact with each other can be reduced. Therefore, contamination, damage, or the like of the substrate 100 can be suppressed.

In a central portion of the placement table 2*a*, a hole 2*a*2 penetrating in a thickness direction of the placement table 2*a* is provided.

One end portion of the rotation shaft 2*b* is engaged in the hole 2*a*2 of the placement table 2*a*. The other end portion of the rotation shaft 2*b* is provided outside the housing 6. The rotation shaft 2*b* is connected to the drive portion 2*c* outside the housing 6.

The rotation shaft 2*b* has a cylindrical shape.

In an end portion on a side of the placement table 2*a* of the rotation shaft 2*b*, a blow-out portion 2*b*1 is provided. The blow-out portion 2*b*1 opens to a surface on which the plurality of projection portions 2*a*1 is provided of the placement table 2*a*. An end portion on a side of the opening of the blow-out portion 2*b*1 is connected to an inner wall of the hole 2*a*2. The opening of the blow-out portion 2*b*1 faces a surface of the substrate 100 placed on the placement table 2*a*.

The blow-out portion 2*b*1 has a shape such that a sectional area increases toward a side of the placement table 2*a* (a side of the opening). Therefore, an inner hole of the blow-out portion 2*b*1 has a shape such that a sectional area increases toward a side of the placement table 2*a* (a side of the opening).

Incidentally, a case where the blow-out portion 2*b*1 is provided at a tip of the rotation shaft 2*b* is illustrated, however, the blow-out portion 2*b*1 can also be provided at a tip of a cooling nozzle 3*d*. Further, the hole 2*a*2 of the placement table 2*a* can also be made to function as the blow-out portion 2*b*1.

By providing the blow-out portion 2*b*1, a released cooling gas 3*a*1 can be supplied to a wider region on a side of the placement table 2*a* of the substrate 100. Further, a release speed of the cooling gas 3*a*1 can be decreased. Therefore, the substrate 100 can be prevented from being partially cooled, or the cooling speed of the substrate 100 can be prevented from being too high.

As a result, the below-mentioned liquid 101 can be easily brought into a supercooled state. In addition, the liquid 101 can be brought into a supercooled state in a wider region of the substrate 100. Therefore, the contaminant removal efficiency can be improved.

An end portion on an opposite side to the placement table 2*a* of the rotation shaft 2*b* is closed. Into the end portion on the opposite side to the placement table 2*a* of the rotation shaft 2*b*, the cooling nozzle 3*d* is inserted. Between the end portion on the opposite side to the placement table 2*a* of the rotation shaft 2*b* and the cooling nozzle 3*d*, a rotation shaft seal (not shown) is provided. Therefore, the end portion on the opposite side to the placement table 2*a* of the rotation shaft 2*b* is sealed hermetically, and also fixed.

The drive portion 2*c* is provided outside the housing 6. The drive portion 2*c* is connected to the rotation shaft 2*b*. The drive portion 2*c* can be configured to have a rotating device such as a motor. A rotational force of the drive portion 2*c* is transmitted to the placement table 2*a* through the rotation shaft 2*b*. Therefore, by the drive portion 2*c*, not only the placement table 2*a*, but also the substrate 100 placed on the placement table 2*a* can be rotated.

Further, the drive portion 2*c* not only can start rotation and stop rotation, but also can change the number of rotations (rotation speed). The drive portion 2*c* can include, for example, a control motor such as a servomotor.

The cooling portion 3 directly supplies the cooling gas 3*a*1 to a surface on an opposite side to a surface to which the liquid 101 is supplied (a surface on a side of the placement table 2*a*) of the substrate 100.

The cooling portion 3 has a cooling liquid portion 3*a*, a filter 3*b*, a flow rate control portion 3*c*, and the cooling nozzle 3*d*.

The cooling liquid portion 3*a*, the filter 3*b*, and the flow rate control portion 3*c* are provided outside the housing 6.

The cooling liquid portion 3*a* stores the cooling liquid and produces the cooling gas 3*a*1.

The cooling liquid is a material obtained by liquefying the cooling gas 3*a*1.

The cooling gas 3*a*1 is not particularly limited as long as it is a gas which hardly reacts with a material of the substrate 100.

The cooling gas 3*a*1 can be, for example, an inert gas such as nitrogen gas, helium gas, or argon gas. In this case, by using a gas having a high specific heat, a cooling time for the substrate 100 can be reduced. For example, by using helium gas, a cooling time for the substrate 100 can be reduced. Further, by using nitrogen gas, a treatment cost for the substrate 100 can be reduced.

The cooling liquid portion 3*a* has a tank which stores the cooling liquid and a vaporization portion which vaporizes the cooling liquid stored in the tank. In the tank, a cooling device for maintaining the temperature of the cooling liquid is provided. The vaporization portion produces the cooling gas 3*a*1 from the cooling liquid by increasing the temperature of the cooling liquid. The vaporization portion can be, for example, a portion which utilizes an outside air temperature, or uses heating by a heating medium. The temperature of the cooling gas 3*a*1 may be any temperature as long as the liquid 101 can be brought into a supercooled state by cooling the liquid 101 to a temperature not higher than the solidifying point. Therefore, the temperature of the cooling gas 3*a*1 may be a temperature not higher than the solidifying point of the liquid 101, and the temperature of the cooling gas 3*a*1 can be set to, for example, −170° C.

The filter 3*b* is connected to the cooling liquid portion 3*a* through a pipe. The filter 3*b* prevents a contaminant such as a particle contained in the cooling liquid from flowing out to a side of the substrate 100.

The flow rate control portion 3*c* is connected to the filter 3*b* through a pipe.

The flow rate control portion 3*c* controls a flow rate of the cooling gas 3*a*1. The flow rate control portion 3*c* can be, for example, an MFC (Mass Flow Controller) or the like. Further, the flow rate control portion 3*c* may be a portion which indirectly controls a flow rate of the cooling gas 3*a*1 by controlling a supply pressure of the cooling gas 3*a*1. In this case, the flow rate control portion 3*c* can be, for example, an APC (Auto Pressure Controller) or the like.

The temperature of the cooling gas 3*a*1 produced from the cooling liquid in the cooling liquid portion 3*a* is substantially a predetermined temperature. Due to this, the flow rate control portion 3*c* can control not only the temperature of the substrate 100, but also the temperature of the liquid 101 on the substrate 100 by controlling the flow rate of the cooling gas 3*a*1. In this case, the flow rate control portion 3*c* brings the liquid 101 into a supercooled state in the below-mentioned supercooling process by controlling the flow rate of the cooling gas 3*a*1.

One end portion of the cooling nozzle 3*d* is connected to the flow rate control portion 3*c*. The other end portion of the cooling nozzle 3*d* is provided inside the rotation shaft 2*b*. The other end portion of the cooling nozzle 3*d* is located in a vicinity of an end portion on a side of the flow rate control portion 3*c* of the blow-out portion 2*b*1.

The cooling nozzle 3*d* has a cylindrical shape. The cooling nozzle 3*d* supplies the cooling gas 3*a*1 whose flow rate is controlled by the flow rate control portion 3c to the substrate 100. The cooling gas 3a1 released from the cooling nozzle 3d is directly supplied to a surface on an opposite side to a surface to which the liquid 101 is supplied of the substrate 100 through the blow-out portion 2b1.

The first liquid supply portion 4 supplies the liquid 101 to a surface on an opposite side to the placement table 2a of the substrate 100.

In the below-mentioned freezing process, when the liquid 101 is changed from a liquid to a solid (liquid-solid phase change), the volume is changed, and therefore, a pressure wave is generated. It is considered that by this pressure wave, a contaminant adhered to the surface of the substrate 100 is separated. Therefore, the liquid 101 is not particularly limited as long as it hardly reacts with a material of the substrate 100.

However, it is also considered that when a liquid whose volume increases at the time of freezing is used as the liquid 101, by utilizing a physical force resulting from the increase in the volume, a contaminant adhered to the surface of the substrate 100 can be separated. Therefore, it is preferred to use a liquid which hardly reacts with the material of the substrate 100 and whose volume increases at the time of freezing as the liquid 101. For example, the liquid 101 can be water (for example, pure water, ultrapure water, or the like), a liquid containing water as a main component, or the like.

The liquid containing water as a main component can be, for example, a mixed liquid of water and an alcohol, a mixed liquid of water and an acidic solution, a mixed liquid of water and an alkaline solution, or the like.

When a mixed liquid of water and an alcohol is used, a surface tension can be decreased, and therefore, the liquid 101 can be easily supplied to the inside of the minute concave convex portion formed on the surface of the substrate.

When a mixed liquid of water and an acidic solution is used, a contaminant such as a particle or a resist residue adhered to the surface of the substrate 100 can be dissolved. For example, when a mixed liquid of water and sulfuric acid or the like is used, a contaminant composed of a resist or a metal can be dissolved.

When a mixed liquid of water and an alkaline solution is used, a zeta potential can be decreased, and therefore, a contaminant which is separated from the surface of the substrate 100 can be prevented from being adhered to the surface of the substrate 100 again.

However, if rest of a component other than water is too much, it becomes difficult to utilize a physical force resulting from the increase in the volume, and therefore, the contaminant removal efficiency may be decreased. Therefore, the concentration of the component other than water is preferably set to 5 wt % or more and 30 wt % or less.

Further, in the liquid 101, a gas can be dissolved. The gas can be, for example, carbon dioxide gas, ozone gas, hydrogen gas, or the like.

When carbon dioxide gas is dissolved in the liquid 101, a conductivity of the liquid 101 can be increased, and therefore, electrification removal or electrification prevention of the substrate 100 can be performed.

By dissolving ozone gas in the liquid 101, a contaminant composed of an organic material can be dissolved.

The first liquid supply portion 4 has a liquid storage portion 4a, a supply portion 4b, a flow rate control portion 4c, and a liquid nozzle 4d.

The liquid storage portion 4a, the supply portion 4b, and the flow rate control portion 4c are provided outside the housing 6.

The liquid storage portion 4a stores the liquid 101.

The supply portion 4b is connected to the liquid storage portion 4a through a pipe. The supply portion 4b supplies the liquid 101 stored in the liquid storage portion 4a to the liquid nozzle 4d. The supply portion 4b can be, for example, a pump or the like having resistance to the liquid 101. Incidentally, a case where the supply portion 4b is a pump is illustrated, however, the supply portion 4b is not limited to the pump. For example, the supply portion 4b can be configured to supply a gas into the liquid storage portion 4a so as to press-feed the liquid 101 stored in the liquid storage portion 4a.

The flow rate control portion 4c is connected to the supply portion 4b through a pipe. The flow rate control portion 4c controls a flow rate of the liquid 101 supplied from the supply portion 4b. The flow rate control portion 4c can be, for example, a flow rate control valve.

Further, the flow rate control portion 4c also performs start and stop of the supply of the liquid 101.

The liquid nozzle 4d is provided inside the housing 6. The liquid nozzle 4d has a cylindrical shape. One end portion of the liquid nozzle 4d is connected to the flow rate control portion 4c through a pipe. The other end portion of the liquid nozzle 4d faces a surface on which the concave convex portion is formed of the substrate 100 placed on the placement table 2a. Therefore, the liquid 101 ejected from the liquid nozzle 4d is supplied to the surface on which the concave convex portion is formed of the substrate 100.

Further, the other end portion (an ejection port for ejecting the liquid 101) of the liquid nozzle 4d is located nearly at a center of a region where the concave convex portion of the substrate 100 is formed. The liquid 101 ejected from the liquid nozzle 4d spreads from the center of the region where the concave convex portion of the substrate 100 is formed, and a liquid film having a fixed thickness is formed on the substrate.

The second liquid supply portion 5 supplies a liquid 102 to a surface on an opposite side to the placement table 2a of the substrate 100.

The second liquid supply portion 5 has a liquid storage portion 5a, a supply portion 5b, a flow rate control portion 5c, and the liquid nozzle 4d.

The liquid 102 is used in the below-mentioned thawing process. Therefore, the liquid 102 is not particularly limited as long as it hardly reacts with the material of the substrate 100 and hardly remains on the substrate 100 in the below-mentioned drying process. The liquid 102 can be, for example, water (for example, pure water, ultrapure water, or the like), a mixed liquid of water and an alcohol, or the like.

The liquid storage portion 5a can be configured in the same manner as the liquid storage portion 4a described above.

The supply portion 5b can be configured in the same manner as the supply portion 4b described above. The flow rate control portion 5c can be configured in the same manner as the flow rate control portion 4c described above.

Incidentally, in the case where the liquid 102 and the liquid 101 are the same, the second liquid supply portion 5 can be omitted. Further, a case where the liquid nozzle 4d is shared is illustrated, however, it is also possible to separately provide a liquid nozzle which ejects the liquid 101 and a liquid nozzle which ejects the liquid 102.

Further, the temperature of the liquid 101 can be set to a higher temperature than the solidifying point of the liquid

101. The temperature of the liquid 101 can be set to, for example, about normal temperature (20° C.). Further, the temperature of the liquid 102 can be set to a temperature at which the frozen liquid 101 can be thawed. The temperature of the liquid 102 can be set to, for example, about normal temperature (20° C.).

The housing 6 has a box shape.

In the housing 6, a cover 6*a* is provided. The cover 6*a* is supplied to the substrate 100 and catches the liquid 101 supplied to the substrate 100 and discharged to the outside of the substrate 100 by rotating the substrate 100. The cover 6*a* has a cylindrical shape. An end portion (an end portion on an upper side in FIG. 1) on an opposite side to the placement table 2*a* of the cover 6*a* is curved toward the center of the cover 6*a*. Therefore, the liquid 101 scattered above the substrate 100 can be easily captured.

Further, in the housing 6, a partition plate 6*b* is provided. The partition plate 6*b* is provided between an outer surface of the cover 6*a* and an inner surface of the housing 6.

On a side surface on a side of a bottom surface of the housing 6, a discharge port 6*c* is provided. The used cooling gas 3*a*1, air 7*a*, the liquid 101, and the liquid 102 are discharged to the outside of the housing 6 from the discharge port 6*c*.

To the discharge port 6*c*, a discharge pipe 6*c*1 is connected, and to the discharge pipe 6*c*1, the exhaust portion (pump) 11 which exhausts the used cooling gas 3*a*1 and the air 7*a* is connected. Further, to the discharge port 6*c*, also a discharge pipe 6*c*2 which discharges the liquids 101 and 102 is connected.

The discharge port 6*c* is provided below the substrate 100. Therefore, by exhausting the cooling gas 3*a*1 from the discharge port 6*c*, a downflow is formed. As a result, it is possible to prevent a particle from being whirled up.

In FIG. 1 and the below-mentioned FIG. 6, when the housing 6 is viewed in plan view, the discharge port 6*c* is provided so that it is symmetric with respect to the center of the housing 6. In the case of FIG. 1, two discharge ports 6*c* are provided. Therefore, the flow of the cooling gas symmetric with respect to the center of the housing 6 can be formed. Then, by making the flow of the cooling gas symmetric, uniform cooling on the surface of the substrate 100 can be achieved.

The air blowing portion 7 is provided on a surface of the ceiling of the housing 6. Incidentally, the air blowing portion 7 can also be provided on a side surface on a side of the ceiling of the housing 6. The air blowing portion 7 can be configured to include a filter and an air blowing machine such as a fan. The filter can be, for example, an HEPA filter (High Efficiency Particulate Air Filter) or the like.

The air blowing portion 7 supplies air 7*a* (outside air) to a space between the partition plate 6*b* and the ceiling of the housing 6. Therefore, a pressure in the space between the partition plate 6*b* and the ceiling of the housing 6 is higher than an external pressure. As a result, the air 7*a* supplied by the air blowing portion 7 can be easily guided to the discharge port 6*c*. Further, a contaminant such as a particle can be prevented from entering inside the housing 6 from the discharge port 6*c*.

Further, the air blowing portion 7 supplies the air 7*a* at room temperature to a surface on an opposite side to the placement table 2*a* of the substrate 100. Due to this, the air blowing portion 7 can change the temperatures of the liquids 101 and 102 on the substrate 100 by controlling the supply amount of the air 7*a*. Therefore, the air blowing portion 7 can control the supercooled state of the liquid 101 in the below-mentioned supercooling process, can promote freezing of the liquid 101 in the freezing process, or can promote drying of the liquid 102 in the drying process.

The measurement portion 8 is provided in the space between the partition plate 6*b* and the ceiling of the housing 6.

The measurement portion 8 can measure the temperature of the liquid 101 on the substrate 100. In this case, the measurement portion 8 can be, for example, a radiation thermometer. Further, the measurement portion 8 can be a measurement portion which measures the thickness of the liquid 101 (the thickness of the liquid film) on the substrate 100. In this case, the measurement portion 8 can be, for example, a laser displacement meter, an ultrasonic displacement meter, or the like.

The measured temperature or thickness of the liquid 101 can be used for controlling the supercooled state of the liquid 101 in the below-mentioned supercooling process.

Incidentally, the "controlling the supercooled state" refers to an operation in which the temperature change curve of the liquid 101 in a supercooled state is controlled so that the liquid 101 is not frozen due to rapid cooling, in other words, the supercooled state is maintained.

The control portion 9 controls the operations of the respective elements provided in the substrate treatment device 1.

The control portion 9 controls, for example, the drive portion 2*c* so as to change the number of rotations (rotation speed) of the substrate 100.

For example, the control portion 9 controls the rotation speed of the substrate 100 so as to make the supplied liquid 101 or liquid 102 spread over the entire region of the substrate 100. The control portion 9 controls the rotation speed of the substrate 100 so as to control the thickness of the liquid 101 on the substrate 100 or discharge the liquid 101 or the liquid 102 from the substrate 100.

The control portion 9 controls, for example, the flow rate control portion 3*c* so as to change the flow rate of the cooling gas 3*a*1.

For example, the control portion 9 controls the flow rate of the cooling gas 3*a*1 so as to control the temperature or the cooling speed of the liquid 101. In this case, the control portion 9 can control not only the flow rate of the cooling gas 3*a*1, but also the temperature or the cooling speed of the liquid 101 based on the temperature of the liquid 101 measured by the measurement portion 8.

Further, the cooling speed of the liquid 101 has a correlation with the thickness of the liquid 101 on the substrate 100. For example, as the thickness of the liquid 101 decreases, the cooling speed of the liquid 101 increases. On the other hand, as the thickness of the liquid 101 increases, the cooling speed of the liquid 101 decreases. Therefore, the control portion 9 can control not only the flow rate of the cooling gas 3*a*1, but also the cooling speed of the liquid 101 based on the thickness of the liquid 101 measured by the measurement portion 8.

Incidentally, the control of the temperature or the cooling speed of the liquid 101 is performed when the supercooled state of the liquid 101 is controlled in the below-mentioned supercooling process.

That is, the control portion 9 brings the liquid 101 on the surface of the substrate 100 into a supercooled state and causes at least a part of the liquid 101 brought into a supercooled state to freeze.

Incidentally, the "causing at least a part to freeze" may be performed such that at least a region covering the concave convex portion formed on the surface of the substrate 100 is frozen.

The control portion 9 causes execution of a series of processes including supplying the liquid 101, supercooling the liquid 101, and freezing the liquid 101 a plurality of times.

The control portion 9 controls at least one of the rotation speed of the substrate 101 and the flow rate of the cooling gas **3*a*1 based on at least one of the temperature of the liquid 101 and the thickness of the liquid 101 measured by the measurement portion 8**.

Further, as described below, the control portion 9 controls at least one of the flow rates of the cooling gas **3*a*1 and a gas 10*d* with a higher temperature than the temperature of the cooling gas 3*a*1, and a mixing ratio of the gas 10*d* (see FIG. 6) to the cooling gas 3*a*1**.

Next, along with the operation of the substrate treatment device 1, a substrate treatment method according to the embodiment will be illustrated.

Figure 2:
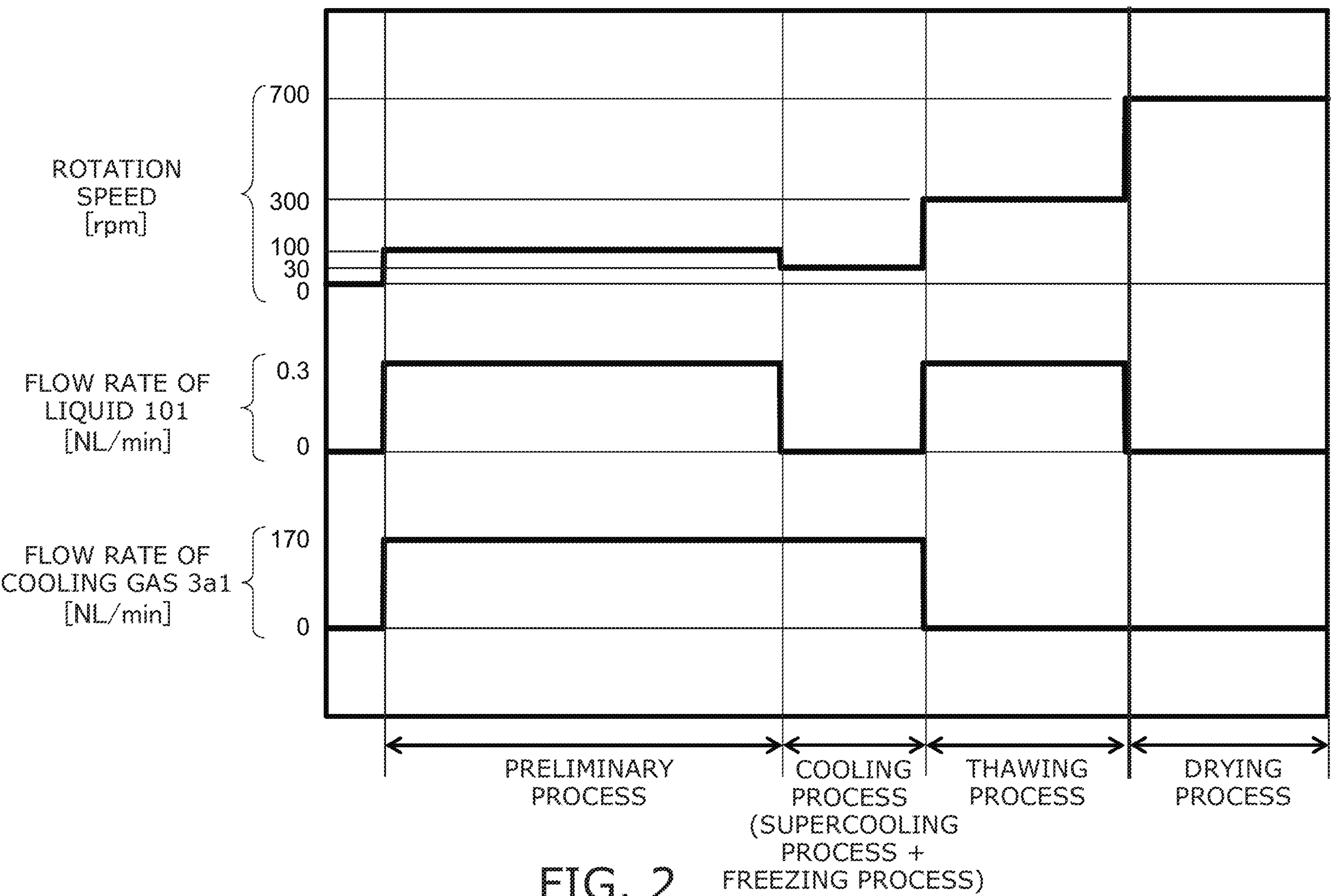
FIG. 2 is a timing chart for illustrating the substrate treatment method according to the embodiment.

FIG. 2 is a timing chart for illustrating the substrate treatment method according to the embodiment.

Incidentally, FIG. 2 shows a case where the substrate 100 is a 6025 quartz (Qz) substrate (152 mm×152 mm×6.35 mm), and the liquid 101 is pure water.

First, the substrate 100 is carried in the housing 6 through a carry-in/carry-out port (not shown) of the housing 6.

The substrate 100 carried therein is placed on the plurality of projection portions **2*a*1 of the placement table 2*a*** and held thereon.

After the substrate 100 is placed and held on the placement table **2*a*, as shown in FIG. 2**, a freezing and cleaning process including a preliminary process, a cooling process (a supercooling process+a freezing process), a thawing process, and a drying process is performed.

First, as shown in FIG. 2, the preliminary process is executed.

In the preliminary process, the control portion 9 controls the supply portion **4*b* and the flow rate control portion 4*c* so as to supply the liquid 101 at a predetermined flow rate to a surface on an opposite side to the placement table 2*a* of the substrate 100**.

Further, the control portion 9 controls the flow rate control portion **3*c* so as to supply the cooling gas 3*a*1 at a predetermined flow rate to a surface on an opposite side to a surface to which the liquid 101 is supplied (a surface on a side of the placement table 2*a*) of the substrate 100. Further, the control portion 9 controls the drive portion 2*c* so as to rotate the substrate 100** at a predetermined rotation speed (first rotation speed).

Here, when an atmosphere in the housing 6 is cooled by supplying the cooling gas **3*a*1 by the cooling portion 3, frost containing dust in the air is adhered to the substrate 100, which may become a cause of contamination. In the preliminary process, the liquid 101 is continuously supplied to the surface, and therefore, adhesion of frost to the surface of the substrate 100 can be prevented while uniformly cooling the substrate 100**.

For example, in the case illustrated in FIG. 2, it is possible to set the rotation speed of the substrate 100 to about 100 rpm, the flow rate of the liquid 101 to about 0.3 NL/min, the flow rate of the cooling gas **3*a*1** to about 170 NL/min, and the process time of the preliminary process to about 1800 sec.

Incidentally, this process time may be any time as long as the surface of the substrate 100 is uniformly cooled. Further, the temperature of the liquid 101 on the substrate 100 in this preliminary process is substantially equal to the temperature of the liquid 101 to be supplied because the liquid 101 is continuously supplied in a flowing state. For example, in the case where the temperature of the liquid 101 to be supplied is about normal temperature (20° C.), the temperature of the liquid 101 present on the substrate 100 (hereinafter referred to as "liquid film") becomes about normal temperature (20° C.).

Subsequently, as shown in FIG. 2, the cooling process (supercooling process+freezing process) is executed.

Incidentally, in this embodiment, in the cooling process, a process from when the liquid 101 is brought into a supercooled state to when the liquid 101 starts to freeze is referred to as "supercooling process", and a process from when the liquid 101 in a supercooled state is brought into a frozen state to when the liquid 101 starts to thaw in the thawing process is referred to as "freezing process".

Here, when the cooling speed of the liquid 101 is too high, the liquid 101 is not brought into a supercooled state, and is frozen immediately.

Therefore, the control portion 9 controls at least one of the flow rate of the cooling gas **3*a*1 and the rotation speed of the substrate 100 so as to bring the liquid 101 on the substrate 100** into a supercooled state.

In the cooling process (supercooling process+freezing process), as illustrated in FIG. 2, supply of the liquid 101 supplied in the preliminary process is stopped, and the rotation speed of the substrate 100 is set to about 30 rpm. This rotation speed is a rotation speed allowing the liquid 101 supplied from the supply portion **4*b* to spread on the substrate 100 so as to form and maintain the liquid film having a uniform thickness on the substrate 100. That is, the control portion causes the substrate 100 to rotate at a rotation speed which is lower than the rotation speed during the preliminary process. Further, the thickness of the liquid film of the liquid 101 at this time can be made not smaller than the height dimension of the concave convex portion. Further, the flow rate of the cooling gas 3*a*1** is maintained at 170 NL/min.

In this manner, in the cooling process (supercooling process+freezing process), by stopping the supply of the liquid 101, the liquid on the substrate 100 stays and heat exchange is not performed. Further, by controlling the rotation speed of the substrate to become the second rotation speed which is lower than the first rotation speed, the liquid on the substrate 100 stays and heat exchange is not performed. Therefore, by a cooling effect of the cooling gas **3*a*1 continuously supplied to the surface on a side of the placement table of the substrate 100, the temperature of the liquid film of the liquid 101 on the substrate 100 is further decreased to a level lower than the temperature of the liquid film during the preliminary process, and therefore, the liquid 101** is brought into a supercooled state.

However, a condition for bringing the liquid 101 into a supercooled state is affected by the size of the substrate 100, the viscosity of the liquid 101, the specific heat of the cooling gas **3*a*1, etc. Therefore, the condition for bringing the liquid 101** into a supercooled state is preferably determined as appropriate by performing an experiment or simulation.

In the freezing process, for example, by further decreasing the temperature of the liquid 101, at least a part of the liquid 101 brought into a supercooled state is frozen. In the case illustrated in FIG. 2, when the temperature of the liquid 101 is decreased to about −30° C., at least a part of the liquid 101 is frozen.

As described above, by stopping new supply of the liquid 101, and continuously supplying the cooling gas **3*a*1, the temperature of the liquid 101 is further decreased, and when the temperature of the liquid 101 has reached a spontaneous freezing temperature, the liquid 101** starts to freeze spontaneously.

However, a condition for freezing the liquid 101 brought into a supercooled state is not limited to the illustrated condition. For example, the flow rate of the cooling gas 3*a*1 may be increased.

Further, the liquid 101 may be frozen by applying vibration to the liquid 101 in a supercooled state or the like. In this case, it is also possible to provide an ultrasonic generator which applies vibration to the liquid 101 on the substrate 100 directly or indirectly through the rotation shaft 2*b* or the like.

In this case, vibration may be applied based on the temperature of the liquid 101 measured by the measurement portion 8. For example, vibration may be applied when the temperature of the liquid 101 has reached a predetermined temperature. The predetermined temperature at this time is a temperature at which the volume expansion coefficient in the freezing process is large, and can be set to, for example, −35° C. or higher and −20° C. or lower. The temperature at which the volume expansion coefficient in the freezing process is large will be described later.

Further, vibration may be applied by changing the rotation speed of the substrate 100 from the second rotation speed to a third rotation speed.

Subsequently, as shown in FIG. 2, the thawing process is executed.

Incidentally, the case illustrated in FIG. 2 is a case where the liquid 101 and the liquid 102 are the same liquid. In FIG. 2, the liquid is shown as the liquid 101.

In the thawing process, the control portion 9 controls the supply portion 4*b* and the flow rate control portion 4*c* so as to supply the liquid 101 at a predetermined flow rate to a surface on an opposite side to the placement table 2*a* of the substrate 100.

Incidentally, in the case where the liquid 101 and the liquid 102 are different liquids, the control portion 9 controls the supply portion 5*b* and the flow rate control portion 5*c* so as to supply the liquid 102 at a predetermined flow rate to a surface on an opposite side to the placement table 2*a* of the substrate 100.

Further, the control portion 9 controls the flow rate control portion 3*c* so as to stop the supply of the cooling gas 3*a*1. Further, the control portion 9 controls the drive portion 2*c* so as to increase the rotation speed of the substrate 100. When the rotation of the substrate 100 is faster, the liquid 101 and the frozen liquid 101 can be shaken off by a centrifugal force and removed from the substrate 100. Therefore, it becomes easy to discharge the liquid 101 and the frozen liquid 101 from the substrate 100. Further, at this time, also a contaminant separated from the surface of the substrate 100 is discharged from the substrate 100.

Incidentally, the supply amounts of the liquid 101 and the liquid 102 are not particularly limited as long as thawing can be achieved. Further, the rotation speed of the substrate 100 is not particularly limited as long as the liquid 101, the frozen liquid 101, and a contaminant can be discharged.

Subsequently, as shown in FIG. 2, the drying process is executed.

In the drying process, the control portion 9 controls the supply portion 4*b* and the flow rate control portion 4*c* so as to stop the supply of the liquid 101.

Incidentally, in the case where the liquid 101 and the liquid 102 are different liquids, the control portion 9 controls the supply portion 5*b* and the flow rate control portion 5*c* so as to stop the supply of the liquid 102.

Further, the control portion 9 controls the drive portion 2*c* so as to further increase the rotation speed of the substrate 100. When the rotation of the substrate 100 is faster, the substrate 100 can be dried rapidly. Incidentally, the rotation speed of the substrate 100 is not particularly limited as long as drying can be achieved.

In this manner, the treatment of the substrate 100 (removal of a contaminant) can be performed.

Next, the supercooling process and the freezing process will be further described.

Figure 3:
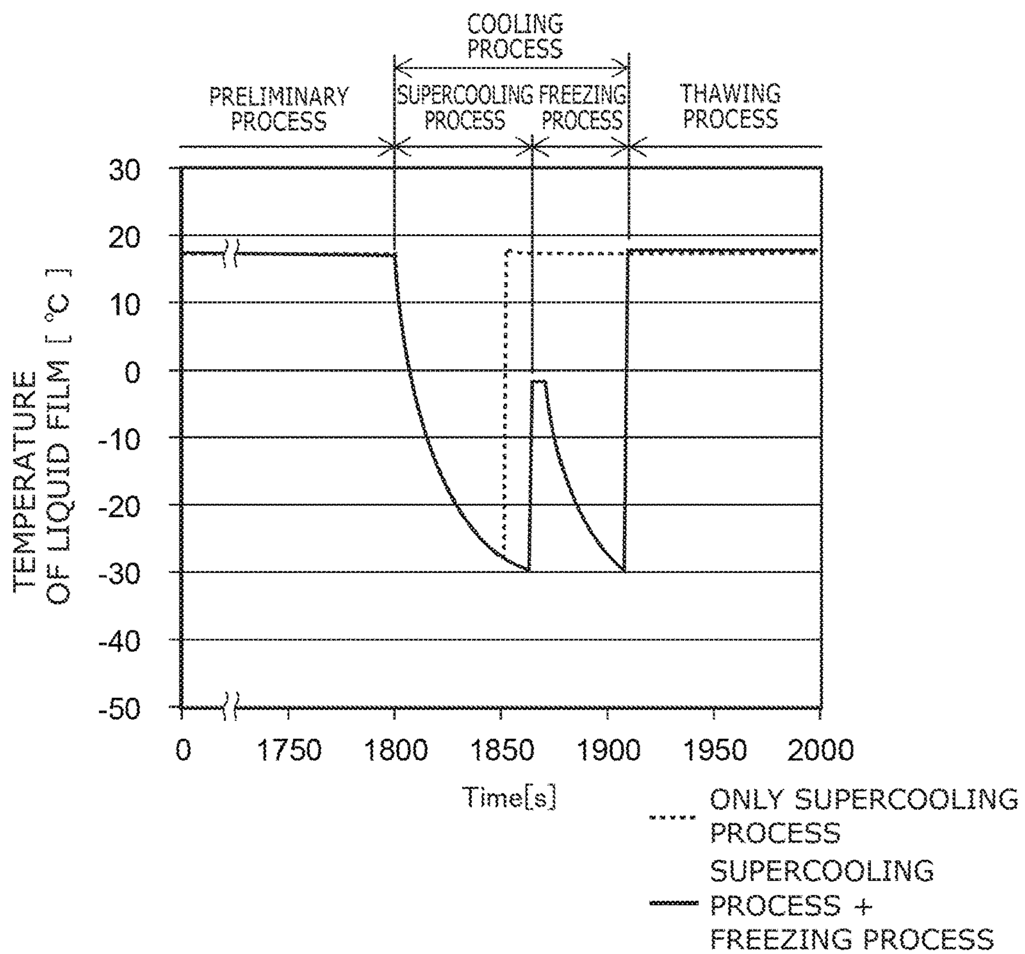
FIG. 3 is a graph for illustrating a case where only the supercooling process was performed, and a case where the supercooling process and the freezing process were performed.

FIG. 3 is a graph for illustrating a case where only the supercooling process was performed, and a case where the supercooling process and the freezing process were performed. Incidentally, in the graph, a broken line indicates the case where only supercooling was performed, and a solid line indicates the case where the supercooling process and the freezing process were performed.

Further, as the temperature of the liquid film, the temperature of the liquid 101 in a supercooled state in the supercooling process is shown, and the temperature of a mixture of the liquid 101 and the frozen liquid 101 in the freezing process is shown. Further, as shown in FIG. 3, in the freezing process, the temperature of the mixture increases due to the generated solidification heat.

As shown in FIG. 3, if the temperature of the liquid 101 is increased before the liquid 101 is frozen, only the supercooling process can be performed.

However, when only the supercooling process is performed, PRE (Particle Removal Efficiency) is decreased as compared with the case where the supercooling process and the freezing process are performed. That is, a change in the volume of the liquid 101 does not occur when the freezing process is not performed, and therefore, a contaminant adhered to the surface of the substrate 100 does not move or is not separated, and therefore, the particle removal efficiency (contaminant removal efficiency) is decreased.

Incidentally, the PRE can be represented by the following formula when the number of particles before the treatment is represented by NI, and the number of particles after the treatment is represented by NP.

$$\text{PRE}\ (\%)=((NI-NP)/NI)\times 100$$

The number of particles can be measured using a particle counter or the like.

Due to this, in the substrate treatment method according to the embodiment, the freezing process is performed after the supercooling process.

Figure 4:
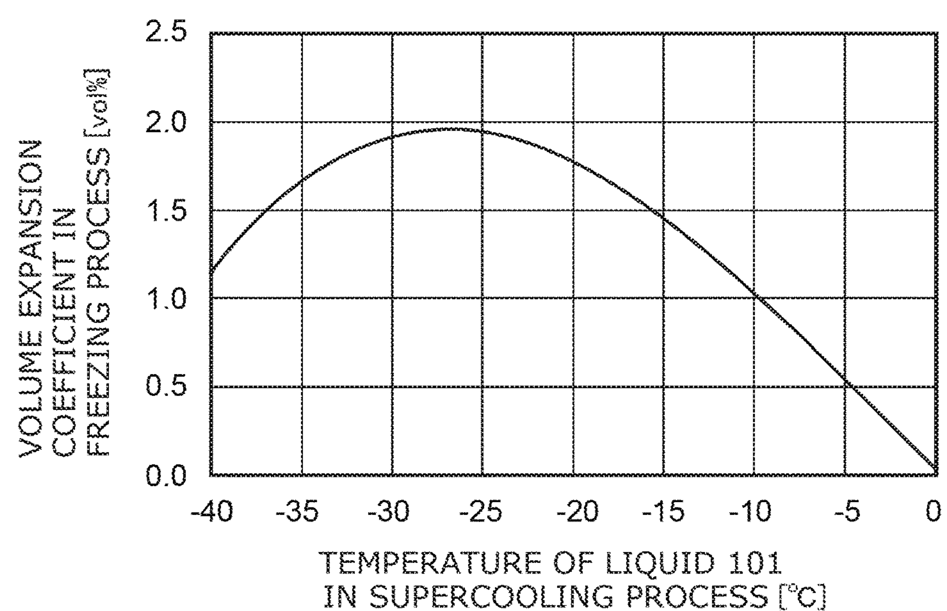
FIG. 4 is a graph for illustrating a relationship between the temperature of the liquid in the supercooling process and the volume expansion coefficient in the freezing process.

FIG. 4 is a graph for illustrating a relationship between the temperature of the liquid 101 in the supercooling process and the volume expansion coefficient in the freezing process.

Incidentally, FIG. 4 shows a case where the liquid 101 is pure water. Further, in the freezing process, not all liquid 101 is frozen. Therefore, FIG. 4 shows a case where the liquid 101 and the frozen liquid 101 exist (a case where water and ice exist).

As shown in FIG. 4, in the case where the liquid 101 is pure water, the temperature of the liquid 101 in the supercooling process is preferably set to −35° C. or higher and −20° C. or lower.

By doing this, the volume expansion coefficient in the freezing process can be increased. As described above, it is considered that in the separation of a contaminant from the surface of the substrate 100, a pressure wave resulting from a liquid-solid phase change and a physical force resulting from the increase in the volume are involved. Therefore, the temperature of the liquid 101 in a supercooled state is controlled to become a temperature at which the volume expansion coefficient in the freezing process is large. That is, when the temperature of the liquid 101 in the supercooling process is set to −35° C. or higher and −20° C. or lower, the contaminant removal efficiency can be improved.

Incidentally, a case where the liquid 101 is pure water is described above, however, the same applies to a case where the liquid 101 contains water as a main component. That is, if the liquid 101 contains water, the temperature of the liquid 101 in the supercooling process is preferably set to −35° C. or higher and −20° C. or lower.

Figure 5:
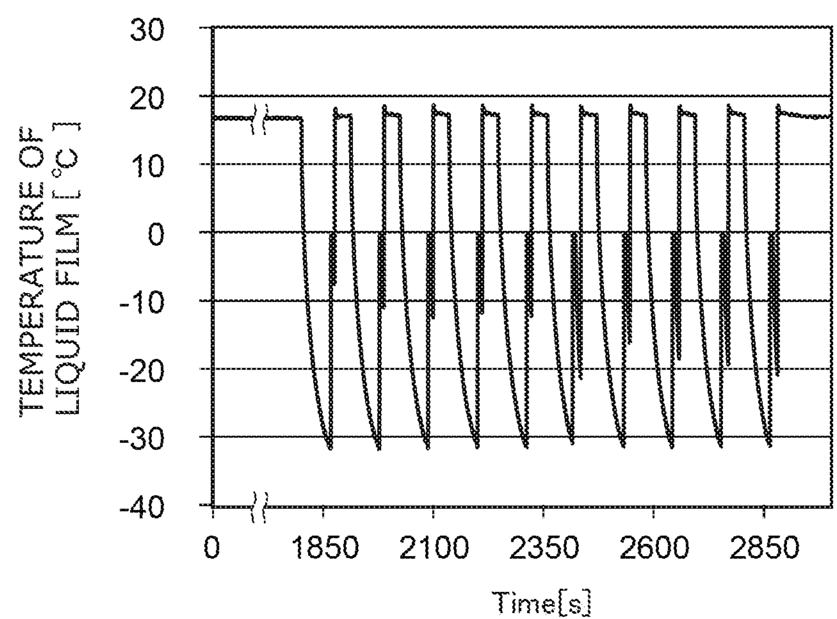
FIG. 5 is a graph for illustrating a case where the process of supplying the liquid, the supercooling process, and the freezing process are repeated a plurality of times.

FIG. 5 is a graph for illustrating a case where the process of supplying the liquid 101, the supercooling process, and the freezing process are repeated a plurality of times. Incidentally, FIG. 5 shows a case where the process of supplying the liquid 101, the supercooling process, and the freezing process are performed 10 times.

Further, as shown in FIG. 5, when the process of supplying the liquid 101 is provided after the freezing process (when the liquid 101 is supplied again), the temperature of the liquid film increases. Therefore, the supercooling process can be performed after the process of supplying the liquid 101. Further, the freezing process can be performed after the supercooling process. Thereafter, in the same manner as above, a series of processes including the process of supplying the liquid 101, the supercooling process, and the freezing process can be repeated a plurality of times.

As described above, in the freezing process, not all liquid 101 is frozen. That is, there may be a case where freezing does not occur in some region. However, in the embodiment, when a series of processes including the process of supplying the liquid 101, the supercooling process, and the freezing process is repeated a plurality of times, the probability of generation of a region where freezing does not occur can be reduced. Therefore, the particle removal efficiency can be improved.

In the embodiment, the cooling gas **3*a*1 is supplied to a surface (back surface) on a side of the placement table 2*a* of the substrate 100 to cool the liquid 101 supplied on the surface of the substrate 100** and bring the liquid film into a supercooled state, and thereafter, the liquid film is frozen. According to this, the following effects are obtained.

When the cooling gas **3*a*1 is sprayed on the back surface of the substrate 100, that is, when the liquid film is cooled through the substrate 100, the liquid 101 is not blown off, and therefore, the liquid film can be frozen while maintaining the film thickness. Therefore, for example, as compared with the case where the cooling gas 3*a*1 is sprayed from the surface of the substrate 100, local freezing does not occur. Due to this, the pressure applied between the concave convex portions provided on the surface of the substrate 100** can be made uniform, and therefore, collapse of the concave convex portions due to uneven freezing can be prevented.

Further, by cooling the liquid film of the liquid 101 supplied on the surface of the substrate 100 to form the liquid film in a supercooled state, and thereafter freezing the liquid film, the liquid film can be frozen while maintaining the thickness of the liquid film formed on the surface of the substrate 100. Therefore, for example, as compared with the case where the liquid brought into a supercooled state is supplied in advance to the surface of the substrate 100, local freezing due to impact of the supply of the liquid brought into a supercooled state onto the substrate 100 does not occur. Due to this, the pressure applied between the concave convex portions provided on the surface of the substrate 100 can be made uniform, and therefore, collapse of the concave convex portions due to uneven freezing can be prevented.

Further, in the embodiment, cooling is achieved in the thickness direction from the back surface to the front surface of the substrate 100. Therefore, even if a temperature gradient is present in the thickness direction of the liquid film of the liquid 101, in the liquid film of the liquid 101, the temperature of an interface between the substrate 100 and the liquid 101 (a surface on a side of the substrate of the liquid film) can be decreased to the lowest level. In this case, freezing starts from the interface between the substrate 100 and the liquid 101 (the surface on a side of the substrate of the liquid film). An adherend adhered to the substrate 100 mainly moves by expansion of the liquid 101 in a vicinity of the interface between the substrate and the liquid 101 and is separated from the substrate, and therefore, the adherend adhered to the surface of the substrate 100 can be efficiently separated.

Further, when a part of the liquid film is frozen, freezing proceeds also in the liquid film therearound by the impact wave or the formation of ice nuclei. Therefore, when the liquid 101 in a vicinity of the interface is frozen, also the liquid 101 in a vicinity of the interface is frozen, however, in the liquid film of the liquid 101, the temperature at which the liquid 101 in a vicinity of the interface starts to freeze can be decreased to the lowest level. As a result, expansion of the liquid 101 in a vicinity of the interface can be increased.

An adherend adhered to the substrate 100 mainly moves by expansion of the liquid 101 in a vicinity of the interface between the substrate and the liquid 101 and is separated from the substrate, and therefore, the adherend adhered to the surface of the substrate 100 can be efficiently separated.

Further, if cooling is performed using the cooling gas **3*a*1, it is possible to perform cooling with high thermal responsiveness by controlling the flow rate. Therefore, when a temperature drop curve is controlled, rapid cooling of the liquid 101** can be suppressed. Further, the temperature until freezing can also be accurately controlled.

Figure 6:
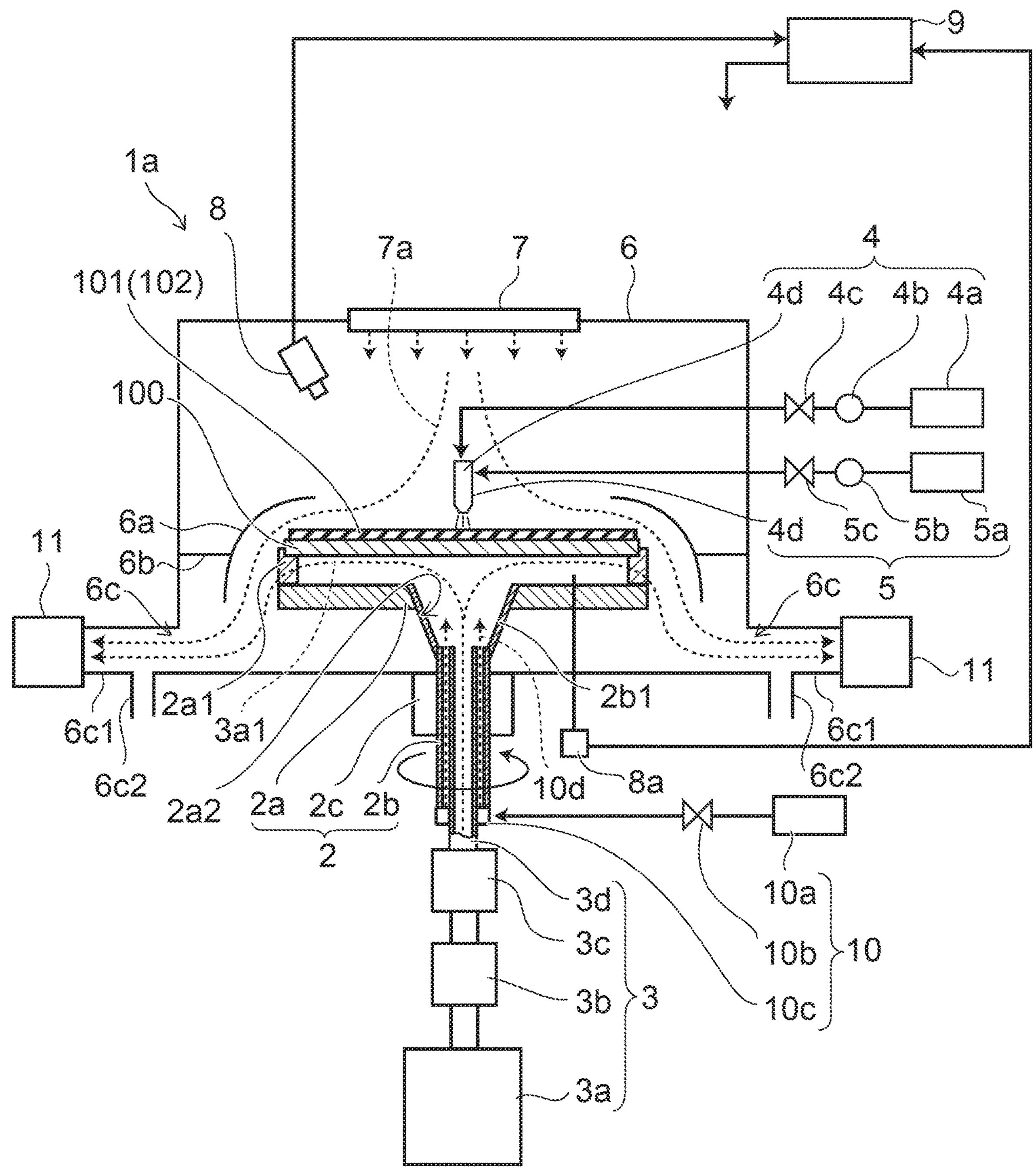
FIG. 6 is a schematic view for illustrating a substrate treatment device 1*a* according to another embodiment.

FIG. 6 is a schematic view for illustrating a substrate treatment device **1*a*** according to another embodiment.

As shown in FIG. 6, in the substrate treatment device **1*a*, a placement portion 2, a cooling portion 3, a first liquid supply portion 4, a second liquid supply portion 5, a housing 6, an air blowing portion 7, a measurement portion 8, a temperature measurement portion 8*a*, a gas supply portion 10, and a control portion 9** are provided.

The temperature measurement portion **8*a* measures the temperature in a space between the substrate 100 and the placement table 2*a*. This temperature is substantially equal to the temperature of a mixed gas obtained by mixing the cooling gas 3*a*1 and the gas 10*d* flowing between the substrate 100 and the placement table 2*a***.

The temperature measurement portion **8*a*** can be, for example, a radiation thermometer or the like.

The gas supply portion 10 has a gas storage portion **10*a*, a flow rate control portion 10*b*, and a connecting portion 10*c***.

The gas storage portion **10*a* stores and supplies the gas 10*d*. The gas storage portion 10*a* can be a high-pressure cylinder, a plant pipe, or the like, in which the gas 10*d*** is contained.

The flow rate control portion **10*b* controls the flow rate of the gas 10*d*. The flow rate control portion 10*b* can be, for example, an MFC which directly controls the flow rate of the gas 10*d* or can be an APC which indirectly controls the flow rate of the gas 10*d*** by controlling the pressure.

The connecting portion **10*c* is connected to a rotation shaft 2*b*. The connecting portion 10*c* connects a space between the rotation shaft 2*b* and a cooling nozzle 3*d* to the flow rate control portion 10***b*. The connecting portion 10*c* can be, for example, a rotary joint.

The gas 10*d* is not particularly limited as long as it hardly reacts with a material of the substrate 100. The gas 10*d* can be, for example, an inert gas such as nitrogen gas, helium gas, or argon gas. In this case, the gas 10*d* can be the same gas as the cooling gas 3*a*1.

However, the temperature of the gas 10*d* is higher than the temperature of the cooling gas 3*a*1. The temperature of the gas 10*d* can be set to, for example, room temperature.

As described above, if the cooling speed of a liquid 101 is too high, the liquid 101 is not brought into a supercooled state, and is frozen immediately. That is, the supercooling process cannot be performed.

In this case, the cooling speed of the liquid 101 can be controlled by at least one of the flow rate of the cooling gas 3*a*1 and the rotation speed of the substrate 100. However, the temperature of the cooling gas 3*a*1 is substantially constant by setting the temperature in the cooling portion which supplies the cooling gas 3*a*1. Therefore, it sometimes becomes difficult to decrease the cooling speed of the liquid 101 by the flow rate of the cooling gas 3*a*1.

Further, the cooling speed can be decreased by decreasing the rotation speed of the substrate 100 so as to increase the thickness of the liquid 101 on the substrate 100. However, there is a limit thickness retained by the surface tension in the thickness of the liquid 101, and therefore, it sometimes becomes difficult to decrease the cooling speed of the liquid 101 by the rotation speed of the substrate 100.

Therefore, in the embodiment, by mixing a gas 10*d* with a higher temperature than the temperature of the cooling gas 3*a*1 with the cooling gas 3*a*1, the cooling speed of the liquid 101 can be decreased. The cooling speed of the liquid 101 can be controlled by the flow rates of the gas 10*d* and the cooling gas 3*a*1, the mixing ratio of the gas 10*d* to the cooling gas 3*a*1, the temperature of the gas 10*d*, or the like.

Further, even if the temperature of the liquid film of the liquid 101 on the substrate 100 is detected by the measurement portion 8 and the flow rate of the cooling gas 3*a*1 is controlled, a difference sometimes occurs between the temperature of the liquid film and the temperature of the surface (back surface) on a side of the placement table of the substrate 100 to be cooled. In this case, when the flow rate of the cooling gas 3*a*1 is controlled based only on the temperature of the liquid film detected by the measurement portion 8, even if the temperature of the liquid film becomes an appropriate temperature, a difference occurs between the temperature of the liquid film and the temperature of the back surface of the substrate 100, and a temperature gradient in the thickness direction of the substrate 100 which greatly affects the freezing process is increased.

In this case, for example, in the process of treating a plurality of substrates, for example, it becomes difficult to perform the same temperature control for the Nth substrate and the N+1th substrate. Due to this, unevenness occurs in the temperature curve of the supercooled state for each substrate, and thus, a freezing timing for each substrate may differ.

However, in the embodiment, the control portion 9 can control at least one of the flow rates of the gas 10*d* and the cooling gas 3*a*1 and the mixing ratio of the gas 10*d* to the cooling gas 3*a*1 based on the temperature measured by the temperature measurement portion 8*a*.

The control portion 9 performs such control in the preliminary process, and can shift the process from the preliminary process to the supercooling process (stop of the supply of the liquid 101) after the difference between the temperature detected by the measurement portion 8 and the temperature detected by the temperature measurement portion 8*a* disappears.

Incidentally, a case where the flow rate control portion 3*c* and the gas supply portion 10 are provided is illustrated, however, in the case where the gas supply portion 10 is provided, it is possible to adjust the temperature of the cooling gas 3*a*1 by supplying the gas 10*d* from the gas supply portion 10 without adjusting the flow rate of the cooling gas 3*a*1 by the flow rate control portion 3*c*. Therefore, it is also possible to omit the flow rate control portion 3*c*.

However, when the flow rate control portion 3*c* and the gas supply portion 10 are provided, the control of the supercooled state of the liquid 101 can be more easily performed.

Further, by controlling the amount of air 7*a* supplied from the air blowing portion 7, it is also possible to control the supercooled state of the liquid 101.

Hereinabove, embodiments are illustrated. However, the invention is not limited to the description.

Those in which design change is appropriately added by a person skilled in the art with respect to the above-mentioned embodiments are also included in the scope of the invention as long as they include the features of the invention.

For example, the shape, dimension, number, arrangement, and the like of each element included in the substrate treatment device 1 are not limited to those illustrated and can be appropriately changed.

For example, in the above-mentioned embodiments, the substrate 100 is cooled by supplying the cooling gas 3*a*1 produced by vaporizing the cooling liquid in the cooling liquid portion 3*a* to the substrate 100, however, the configuration is not limited thereto. For example, a gas at normal temperature is cooled by chiller circulation, and the cooled gas may be used as the cooling gas.

For example, in the above-mentioned embodiments, as shown in FIG. 2, when the process is shifted from the preliminary process to the cooling process, the rotation speed of the substrate 100 and the supply flow rate of the liquid 101 are changed simultaneously, however, the configuration is not limited thereto. For example, after the rotation speed of the substrate 100 is changed from the first rotation speed to the second rotation speed, the supply of the liquid 101 can be stopped.

For example, in the above-mentioned embodiments, as shown in FIG. 2, the rotation speed in the cooling process (supercooling process+freezing process) is constant, however, the configuration is not limited thereto. For example, the rotation speed of the substrate 100 is set to the second rotation speed in the supercooling process, and thereafter can also be changed to the third rotation speed which is larger (higher) than the second rotation speed in the freezing process. In this case, the liquid film on the substrate 100 can be made thin, and by increasing the freezing speed, the treatment time can be reduced.

For example, in the above-mentioned embodiments, the thickness of the liquid film of the liquid 101 formed on the substrate 100 in the cooling process is set to not less than the height dimension of the concave convex portion, but may be a thickness allowing the liquid film to be formed along the shape of the concave convex portion on the side wall surface and the surface of the concave convex portion. In this case, for example, by setting the thickness of the liquid film to not more than half the dimension of the concave convex portion, a space between the side wall surface and the side wall surface of the concave convex portion is not filled with the liquid film, and even if the liquid film is frozen and expanded, a pressure is not applied to the concave convex portion, and thus, collapse of the concave convex portion can be prevented.

For example, in the above-mentioned embodiments, the supply of the cooling gas 3$a$1 by the cooling portion 3 is performed from below (on a lower side in the gravitational direction) the substrate 100 to which the liquid 101 is supplied, however, the substrate 100 is held so as to make the surface on which the concave convex portion is formed of the substrate 100 to which the liquid 101 is supplied face downward, and the supply of the cooling gas 3$a$1 from the cooling portion 3 may be performed from above the substrate 100. According to this configuration, in the drying process, discharge of the liquid component in the concave portion on the surface of the substrate 100 can be accelerated by the force of gravity.

Further, those in which addition, deletion, or design change of a constituent element or addition, omission, or condition change of a process is appropriately made by a person skilled in the art with respect to the above-mentioned embodiments are also included in the scope of the invention as long as they include the features of the invention.

What is claimed is:

1. A substrate treatment method, which comprises:

rotating a substrate;

supplying a liquid to one surface of the substrate;

supplying a cooling gas to the other surface of the substrate;

bringing the liquid present on the surface of the substrate into a supercooled state by controlling at least one of a rotation speed of the substrate, a supply amount of the liquid, and a flow rate of the cooling gas;

freezing at least a part of the liquid brought into the supercooled state by controlling at least one of the rotation speed of the substrate, the supply amount of the liquid, and the flow rate of the cooling gas.

2. The method according to claim 1, wherein in the supplying the liquid and the supplying the cooling gas, the liquid is supplied to one surface of the substrate and the cooling gas is supplied to the other surface of the substrate, and thereafter, in the bringing the liquid into a supercooled state, the supply of the liquid is stopped while maintaining the supply of the cooling gas so as to bring the liquid into a supercooled state.

3. The method according to claim 1, wherein in the supplying the liquid, the substrate is rotated at a first rotation speed, and in the bringing the liquid into a supercooled state, the substrate is rotated at a second rotation speed which is lower than the first rotation speed.

4. The method according to claim 1, wherein the supplying the liquid, the bringing the liquid into a supercooled state, and the freezing at least a part of the liquid brought into the supercooled state are executed a plurality of times.

5. The method according to claim 1, wherein the liquid contains water, and a temperature of the liquid brought into a supercooled state is −35° C. or higher and −20° C. or lower.

6. The method according to claim 1, wherein in the bringing the liquid into a supercooled state, at least one of a temperature of the liquid and a thickness of the liquid is measured, and at least one of a rotation speed of the substrate and a flow rate of the cooling gas is controlled based on at least one of the measured temperature of the liquid and the measured thickness of the liquid.

7. The method according to claim 1, wherein in the supplying the cooling gas, a gas with a higher temperature than a temperature of the cooling gas is mixed with the cooling gas, and in the bringing the liquid into a supercooled state, at least one of flow rates of the gas and the cooling gas and a mixing ratio of the gas to the cooling gas is controlled.

* * * * *